(12) United States Patent
Kobayashi et al.

(10) Patent No.: US 10,789,144 B2
(45) Date of Patent: Sep. 29, 2020

(54) SUPERVISORY CIRCUIT, SUPERVISORY SYSTEM, MOTOR CONTROL SYSTEM

(71) Applicants: Toshiba Electronic Devices & Storage Corporation, Minato-ku, Tokyo (JP); Kabushiki Kaisha Toshiba, Minato-ku, Tokyo (JP)

(72) Inventors: Akihiro Kobayashi, Yokohama Kanagawa (JP); Makoto Kanda, Yokohama Kanagawa (JP); Shigeru Itoh, Kawasaki Kanagawa (JP); Hiroshi Nishikawa, Yokohama Kanagawa (JP); Wataru Furuichi, Moriya Ibaraki (JP); Kiyoshige Taga, Kawasaki Kanagawa (JP); Itsuro Nomura, Hitachinaka Ibaraki (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/118,529

(22) Filed: Aug. 31, 2018

(65) Prior Publication Data
US 2019/0272223 A1 Sep. 5, 2019

(30) Foreign Application Priority Data
Mar. 1, 2018 (JP) ................................. 2018-036663

(51) Int. Cl.
*G06F 11/28* (2006.01)
*G06F 9/38* (2018.01)
(Continued)

(52) U.S. Cl.
CPC .......... *G06F 11/28* (2013.01); *G01R 19/2506* (2013.01); *G06F 9/3857* (2013.01); *G06F 9/4818* (2013.01); *H04Q 3/54591* (2013.01)

(58) Field of Classification Search
CPC ...... G06F 11/28; G06F 9/3857; G06F 9/4818; G01R 19/2506; H04Q 3/54591
See application file for complete search history.

(56) References Cited

U.S. PATENT DOCUMENTS

2003/0105798 A1* 6/2003 Kim ...................... G06F 9/4812
718/105
2005/0193260 A1* 9/2005 Kato ..................... G06F 9/4818
714/34
2017/0104430 A1* 4/2017 Magee ................ H02P 21/0003

FOREIGN PATENT DOCUMENTS

JP H05-012063 A 1/1993
JP 2000-115291 A 4/2000
(Continued)

*Primary Examiner* — Tim T Vo
*Assistant Examiner* — Harry Z Wang
(74) *Attorney, Agent, or Firm* — White & Case LLP

(57) ABSTRACT

According to one embodiment, a supervisory circuit includes a trigger determination circuit and a trigger table. The trigger determination circuit receives signal processing signals outputted from a plurality of signal processing circuits as trigger signals, determines whether processing operations by the signal processing circuits are executed in a predetermined order, and outputs an interrupt signal when detecting a trigger signal out of setting. The trigger table is provided with trigger-specific tables corresponding to the respective signal processing circuits, reads a trigger setting to occur next based on a trigger determined as being correct by the trigger determination circuit, and outputs a table read signal to the trigger determination circuit.

17 Claims, 10 Drawing Sheets

(51) Int. Cl.
    *G01R 19/25*     (2006.01)
    *G06F 9/48*     (2006.01)
    *H04Q 3/545*     (2006.01)

(56) References Cited

FOREIGN PATENT DOCUMENTS

| | | |
|---|---|---|
| JP | 2013-182477 A | 9/2013 |
| JP | 2014-232478 A | 12/2014 |

\* cited by examiner

SUPERVISORY CIRCUIT, SUPERVISORY SYSTEM, MOTOR CONTROL SYSTEM

CROSS REFERENCE TO RELATED APPLICATION

This application is based upon and claims the benefit of priority from the prior Japanese Patent Application No. 2018-036663, filed on Mar. 1, 2018, the entire contents of which are incorporated herein by reference.

FIELD

The embodiments discussed herein relate to a supervisory circuit, a supervisory system, and a motor control system.

BACKGROUND

In a highly-integrated semiconductor integrated circuit such as a system on a chip (SoC), a plurality of programs and a plurality of circuits perform signal processing. It is highly important to supervise the signal processing implemented by the programs and the circuits.

The progress of the programs is checked during program processing. However, there is a problem in that it is difficult to supervise whether the entire program processing is executed in a predetermined order, whether a plurality of sets of signal processing by the circuits are executed in a predetermined order, and whether a plurality of sets of signal processing by the programs and the circuits are executed in a predetermined order.

DETAILED DESCRIPTION

Figure 1:
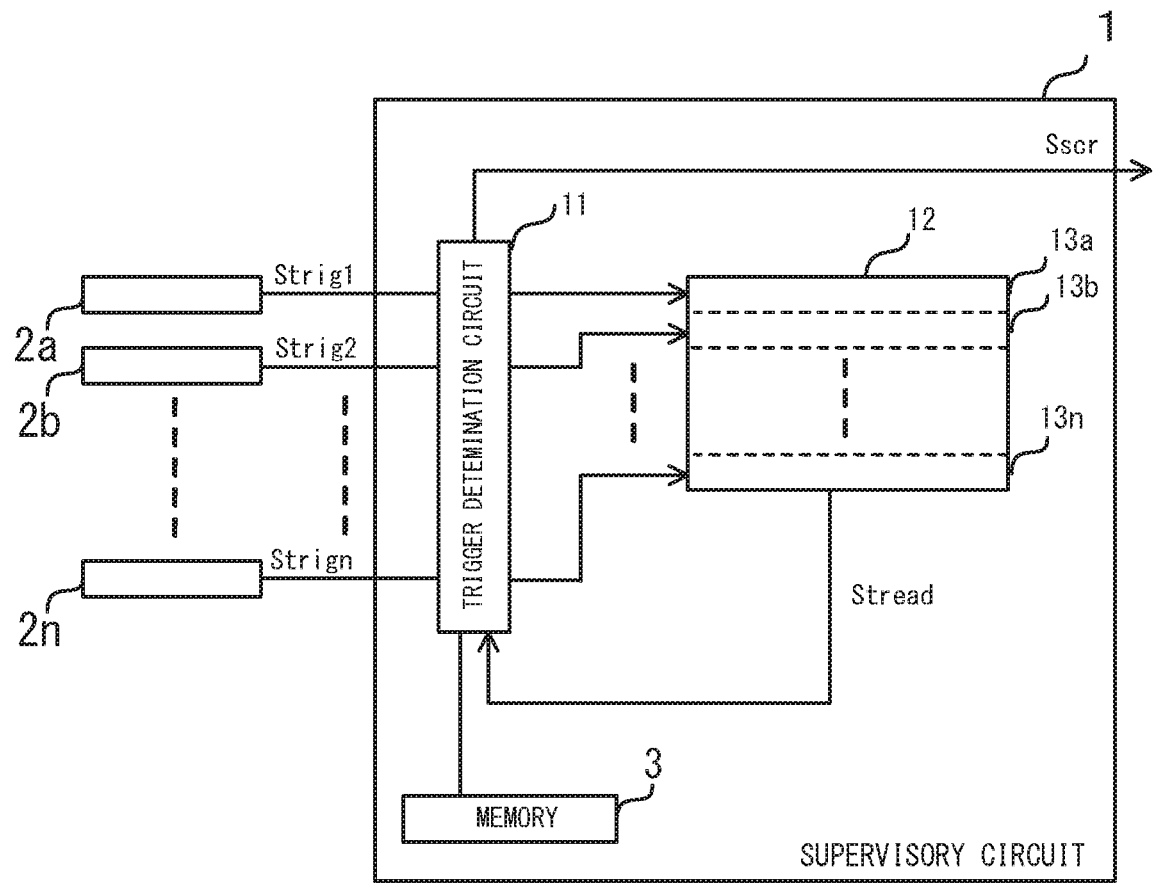
FIG. 1 is a diagram showing a supervisory circuit according to a first embodiment.

According to one embodiment, a supervisory circuit includes a trigger determination circuit and a trigger table. The trigger determination circuit receives signal processing signals outputted from a plurality of signal processing circuits as trigger signals, determines whether processing operations by the signal processing circuits are executed in a predetermined order, and outputs an interrupt signal when detecting a trigger signal out of setting. The trigger table is provided with trigger-specific tables corresponding to the respective signal processing circuits, reads a trigger setting to occur next based on a trigger determined as being correct by the trigger determination circuit, and outputs a table read signal to the trigger determination circuit.

Hereinbelow, further embodiments will be described with reference to the drawings. Throughout the drawings, the same reference numerals denote the same or like portions.

A supervisory circuit according to a first embodiment will be described with reference to FIG. 1. FIG. 1 is a diagram showing the supervisory circuit.

The supervisory circuit of the first embodiment supervises whether processing operations by a plurality of signal processing circuits are executed in a predetermined order.

As shown in FIG. 1, a supervisory circuit 1 includes a memory 3, a trigger determination circuit 11, and a trigger table 12. The supervisory circuit 1 supervises processing operations by n signal processing circuits (where n is an integer of 2 or more), e.g., a signal processing circuit 2a, a signal processing circuit 2b, and a signal processing circuit 2n.

The signal processing circuit 2a, the signal processing circuit 2b, and the signal processing circuit 2n each execute digital signal processing or analog-digital signal processing once or a plurality of times for example, and output a signal obtained by the signal processing to the supervisory circuit 1 as a trigger signal. Specifically, the signal processing circuit 2a outputs a trigger signal Strig1 to the supervisory circuit 1, the signal processing circuit 2b outputs a trigger signal Strig2 to the supervisory circuit 1, and the signal processing circuit 2n outputs a trigger signal Strign to the supervisory circuit 1.

Here, the n trigger signals (namely, the trigger signal Strig1, the trigger signal Strig2, and the trigger signal Strign) are a single job signal or a plurality of job signals. The case of the plurality of job signals include the job signals being outputted in order, the job signals being outputted sequentially at predetermined intervals, and the like.

The digital signal processing includes hardware processing or program processing (software processing) executed by a sequential circuit, a processor, a central processing unit (CPU), a micro-processing unit (MPU), or the like. The sequential circuit includes a flip-flop, a counter, and a register.

The analog-digital signal processing includes analog-to-digital conversion processing executed by an analog-to-digital converter (ADC) or the like and digital-to-analog processing executed by a digital-to-analog converter (DAC) or the like.

The trigger determination circuit 11 receives the trigger signal Strig1, the trigger signal Strig2, the trigger signal Strign, and based on sequence determination information stored in the memory 3, determines whether the trigger signal Strig1, the trigger signal Strig2, and the trigger signal Strign are set in a predetermined order. The predetermined order includes the trigger signal Strig1, the trigger signal Strig2, and the trigger signal Strign being outputted in a chronological order, being in an interchanged order, or being outputted alternately, being in synchronization, being out of synchronization, and the like.

The trigger determination circuit 11 outputs an interrupt signal Sscr when detecting a trigger signal out of setting. The interrupt signal Sscr causes the system to be initialized, for example. The purpose of the interrupt signal is not limited to the system initialization. The interrupt signal may be used as notification information to the CPU, for example.

Here, the sequence determination information is written and stored in the memory 3 at any time by the CPU, MPU, or an outside of the system for example. Although provided inside the supervisory circuit 1 here, the memory 3 may be provided inside the trigger determination circuit 11 or outside the supervisory circuit 1.

The trigger determination circuit 11 outputs each of the trigger signal Strig1, the trigger signal Strig2, and the trigger signal Strign to the trigger table 12.

The trigger table 12 includes n trigger tables (namely a trigger-specific table 13a, a trigger-specific table 13b, and a trigger-specific table 13n). In response to a trigger signal inputted, the trigger table 12 makes a trigger setting to occur next for example. The trigger table 12 reads a trigger setting to occur next based on a trigger determined as being correct by the trigger determination circuit 11, and outputs the trigger setting to the trigger determination circuit 11 as a table read signal Stread.

As described above, the supervisory circuit 1 of the embodiment is provided with the memory 3, the trigger determination circuit 11, and the trigger table 12. The trigger determination circuit 11 receives a plurality of trigger signals and determines, based on the sequence determination information stored in the memory 3, whether the plurality of trigger signals are set in a predetermined order. The trigger table 12 includes a plurality of trigger-specific tables, reads a trigger setting to occur, and outputs a table read signal Stread to the trigger determination circuit 11.

Thus, the supervisory circuit 1 of the embodiment can supervise the processing operations by the plurality of signal processing circuits.

Figure 2:
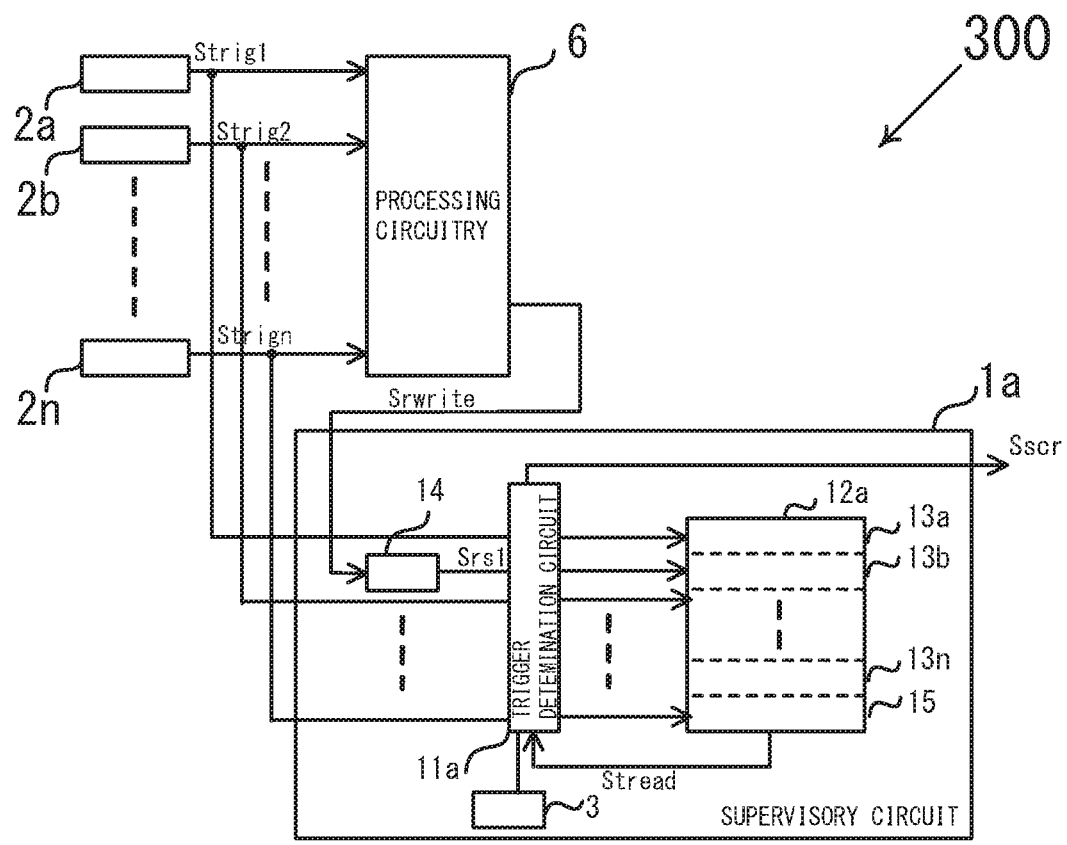
FIG. 2 is a diagram showing a supervisory system according to a second embodiment.

A supervisory system according to a second embodiment will be described with reference to FIG. 2. FIG. 2 is a diagram showing the supervisory system.

The supervisory system of the second embodiment uses a supervisory circuit to supervise whether processing operations by a plurality of signal processing circuits and program processing by a processing circuitry are executed in a predetermined order.

Hereinbelow, the same constituent portions as those in the first embodiment are denoted by the same reference numerals as used in the first embodiment and will not be described again. Only different portions will be described.

As shown in FIG. 2, a supervisory system 300 includes a supervisory circuit 1a and a processing circuitry 6. The processing circuitry 6 is provided to a microcontroller, a processor, a CPU, a MPU, or the like for example.

Figure 3:
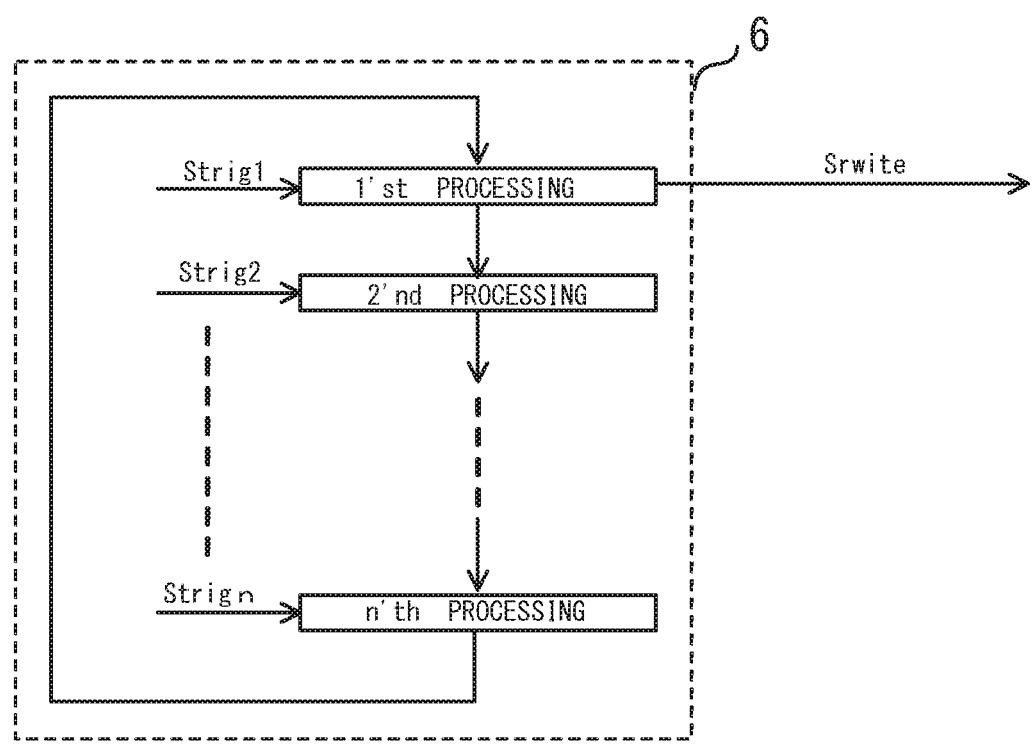
FIG. 3 is a diagram showing processing steps performed by a processing circuitry according to the second embodiment.

As shown in FIG. 3, the processing circuitry 6 executes a cycle of n types of processing (namely first processing, second processing, and n-th processing) which are program processing (software processing) in order, and after the n-th processing, executes the first processing again, repeating the processing cycle a plurality of times.

Here, the first processing is program processing caused to proceed by the trigger signal Strig1 outputted from the signal processing circuit 2a. The second processing is program processing caused to proceed by the trigger signal Strig2 outputted from the signal processing circuit 2b. The n-th processing is program processing caused to proceed by the trigger signal Strign outputted from the signal processing circuit 2n. The processing circuitry 6 selects the first processing for example, and outputs the program processing to the supervisory circuit 1a as a register write signal Srwrite.

The supervisory circuit 1a includes the memory 3, a trigger determination circuit 11a, a trigger table 12a, and a clear code detection circuit 14.

The clear code detection circuit 14 receives the register write signal Srwrite outputted from the processing circuitry 6, selects program processing, e.g., the interrupting first processing, as a particular clear code, and outputs the particular clear code to the trigger determination circuit 11a as a register-specific signal Srs1.

The trigger determination circuit 11a receives the trigger signal Strig1, the register-specific signal Srs1, which is the particular clear code (first processing), the trigger signal Strig2, and the trigger signal Strign, and determines, based on the sequence determination information stored in the memory 3, whether the trigger signal Strig1, the register-specific signal Srs1, which is the particular clear code (first processing), the trigger signal Strig2, and the trigger signal Strign are set in a predetermined order.

When determining that the trigger signal Strig1, the register-specific signal Srs1, which is the particular clear code (first processing), the trigger signal Strig2, and the trigger signal Strign are not set in a predetermined order, i.e., when detecting a trigger signal out of setting, the trigger determination circuit 11a outputs an interrupt signal Sscr.

The trigger determination circuit 11a outputs each of the trigger signal Strig1, the register-specific signal Srs1, the trigger signal Strig2, and the trigger signal Strign to the trigger table 12a.

The trigger table 12a includes the n trigger tables (namely the trigger-specific table 13a, the trigger-specific table 13b, and the trigger-specific table 13n) and a register-specific table 15. In response to a trigger inputted, the trigger table 12a makes a trigger setting to occur next, for example. The trigger table 12a reads a trigger setting to occur next based on a trigger determined as being correct by the trigger determination circuit 11a and outputs the trigger setting to the trigger determination circuit 1a as a table read signal Stread.

As described above, the supervisory system 300 of the embodiment is provided with the supervisory circuit 1a and the processing circuitry 6. The processing circuitry 6 receives trigger signals, executes n types of program processing in order, and executes the first processing again after the n-th processing, repeating the processing cycle a plurality of times. The supervisory circuit 1a includes the memory 3, the trigger determination circuit 11a, the trigger table 12a, and the clear code detection circuit 14. The clear code detection circuit 14 selects a particular clear code. The trigger determination circuit 11a determines, based on the sequence determination information stored in the memory 3, whether the trigger signal Strig1, the particular clear code, the trigger signal Strig2, and the trigger signal Strign are set in a predetermined order. The trigger table 12a includes n trigger tables and the register-specific table 15. In response to a trigger signal inputted, the trigger table 12a makes a trigger setting to occur next, for example.

Thus, the supervisory system 300 of the embodiment can supervise processing operations by the plurality of signal processing circuits and a particular clear code (the n-th processing for example).

Although the register write signal Srwrite is the first processing in the second embodiment, any one of the plurality of kinds of processing may be selected.

Figure 4:
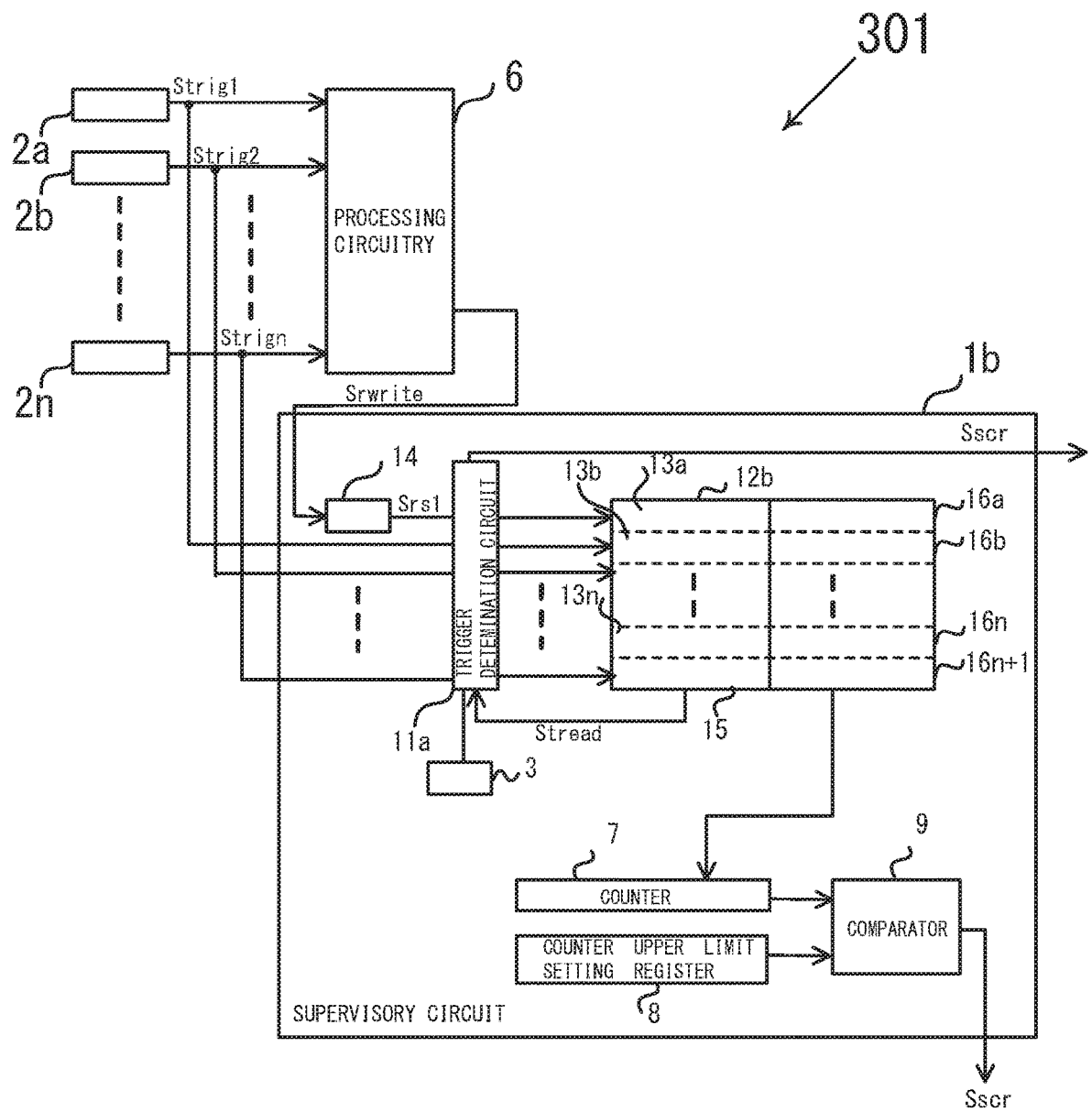
FIG. 4 is a diagram showing a supervisory system according to a third embodiment.

A supervisory system according to a third embodiment will be described with reference to FIG. 4. FIG. 4 is a diagram showing the supervisory system.

The supervisory system of the third embodiment uses a supervisory circuit to supervise whether processing operations by a plurality of signal processing circuits and program processing by a processing circuitry are executed in a predetermined order and within a certain period of time.

Hereinbelow, the same constituent portions as those in the second embodiment are denoted by the same reference numerals as used in the second embodiment and will not be described again. Only different portions will be described.

As shown in FIG. 4, a supervisory system 301 includes a supervisory circuit 1b and the processing circuitry 6. The supervisory circuit 1b includes the memory 3, a counter 7, a counter upper limit setting register 8, a comparator 9, the trigger determination circuit 11a, a trigger table 12b, and the clear code detection circuit 14. Note that in FIG. 4, the n-th processing is used for the register write signal outputted from the clear code detection circuit 14. For this reason, signal arrangement is different from that in FIG. 2.

The trigger table 12b includes n trigger tables, the register-specific table 15, (n+1) initial value effecting tables (an initial value effecting table 16a, an initial value effecting table 16b, an initial value effecting table 16n, and an initial value effecting table 16n+1).

The (n+1) initial value effecting tables give initialization effecting attributes to the corresponding trigger tables. For instance, when an initialization effecting attribute is given to the initial value effecting table 16a corresponding to the trigger-specific table 13a, the initial value effecting table 16a is set to "1", and the initial value effecting table 16b, the initial value effecting table 16n, and the initial value effecting table 16n+1 are set to "0 (zero)".

When the counter 7 receives the "1" information on the initial value effecting table 16a, the counter 7 initializes counting, and then continues counting. The counter 7 keeps counting until the initial value effecting table 16n+1 corresponding to the register-specific table 15 becomes "1". When a watchdog timer uses for the counter 7, the watchdog timer starts counting, initializes a count value, and continues counting. The watchdog timer always operates.

The counter upper limit setting register 8 sets an upper-limit value for the counter 7. The comparator 9 compares a counter value from the counter 7 with the upper-limit value for the counter 7 stored in the counter upper limit setting register 8. For example, when a particular clear code (a register write by the n-th processing) is not executed, a count value from the counter 7 exceeds the counter upper-limit value. Thus, the comparator 9 generates an interrupt signal Sscr.

As described above, the supervisory system 301 of the embodiment is provided with the supervisory circuit 1b and the processing circuitry 6. The supervisory circuit 1b has the memory 3, the counter 7, the counter upper limit setting register 8, the comparator 9, the trigger determination circuit 11a, the trigger table 12b, and the clear code detection circuit 14. The comparator 9 compares a count value from the counter 7 with the upper-limit value for the counter 7 stored in the counter upper limit setting register 8. The comparator 9 generates an interrupt signal Sscr when a particular clear code is not executed, for example.

Thus, the supervisory system 301 of the embodiment can supervise whether processing operations by the plurality of signal processing circuits and a particular clear code (e.g., the n-th processing) are executed in a predetermined order within a certain period of time.

Figure 5:
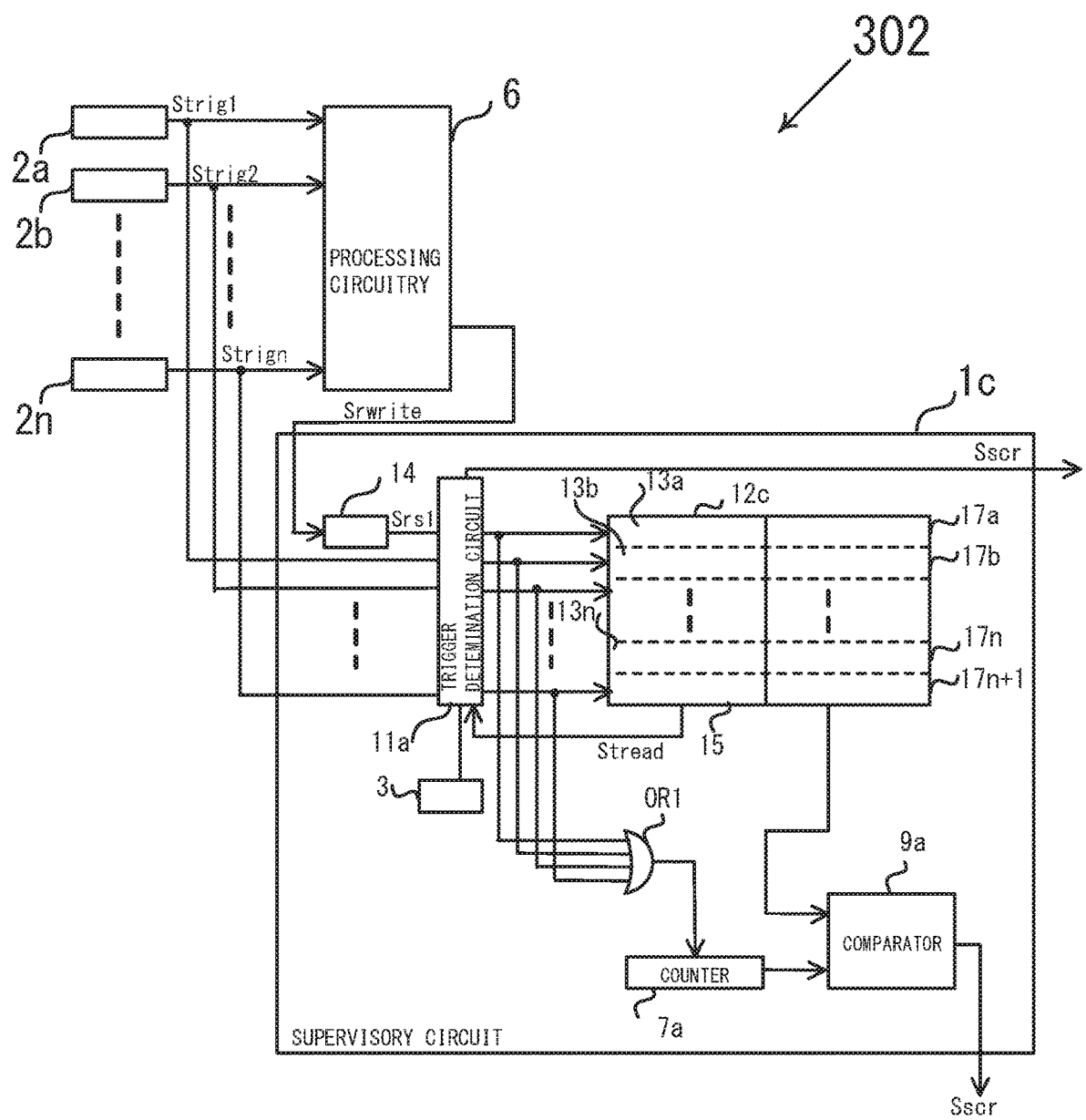
FIG. 5 is a diagram showing a supervisory system according to a fourth embodiment.

A supervisory system according to a fourth embodiment will be described with reference to FIG. 5. FIG. 5 is a diagram showing the supervisory system.

The supervisory system of the fourth embodiment uses a supervisory circuit to supervise whether processing operations by a plurality of signal processing circuits and programming processing by a processing circuitry are executed in a predetermined order and to supervise whether the next trigger is inputted within a set inter-trigger time period.

Hereinbelow, the same constituent portions as those in the second embodiment are denoted by the same reference numerals as used in the second embodiment and will not be described again. Only different portions will be described.

As shown in FIG. 5, a supervisory system 302 includes a supervisory circuit 1c and the processing circuitry 6. The supervisory circuit 1c includes the memory 3, a counter 7a, a comparator 9a, the trigger determination circuit 11a, a trigger table 12c, the clear code detection circuit 14, and an OR circuit OR1.

The trigger table 12c includes n trigger tables, the register-specific table 15, (n+1) counter upper-limit value tables (a counter upper-limit value table 17a, a counter upper-limit value table 17b, a counter upper-limit value table 17n, and a counter upper-limit value table 17n+1). The (n+1) counter upper-limit value tables give counter upper-limit values to the trigger tables.

The OR circuit OR1 receives a trigger signal Strig1, a trigger signal Strig2, a trigger signal Strign, and a register-specific signal Srs1 and performs logical operation processing (OR processing). The counter 7a receives information outputted from the OR circuit OR1 as initialization information and starts a count operation.

The comparator 9a compares information in the counter upper-limit tables with the count value from the counter 7a. The comparator 9a generates an interrupt signal Sscr when the next trigger is not inputted within a set inter-trigger time period.

As described above, the supervisory system 302 of the embodiment is provided with the supervisory circuit 1c and the processing circuitry 6. The supervisory circuit 1c has the memory 3, the counter 7a, the comparator 9a, the trigger determination circuit 11a, the trigger table 12c, the clear code detection circuit 14, and the OR circuit OR1. The comparator 9a compares a count value from the counter 7a with the upper-limit value in the register. The comparator 9a generates an interrupt signal Sscr when the next trigger is not inputted within a set inter-trigger time period.

Thus, the supervisory system 302 of the embodiment can supervise whether processing operations by the plurality of signal processing circuits and program processing by the processing circuitry are executed in a predetermined order and supervise whether the next trigger is inputted within a set inter-trigger time period.

Figure 6:
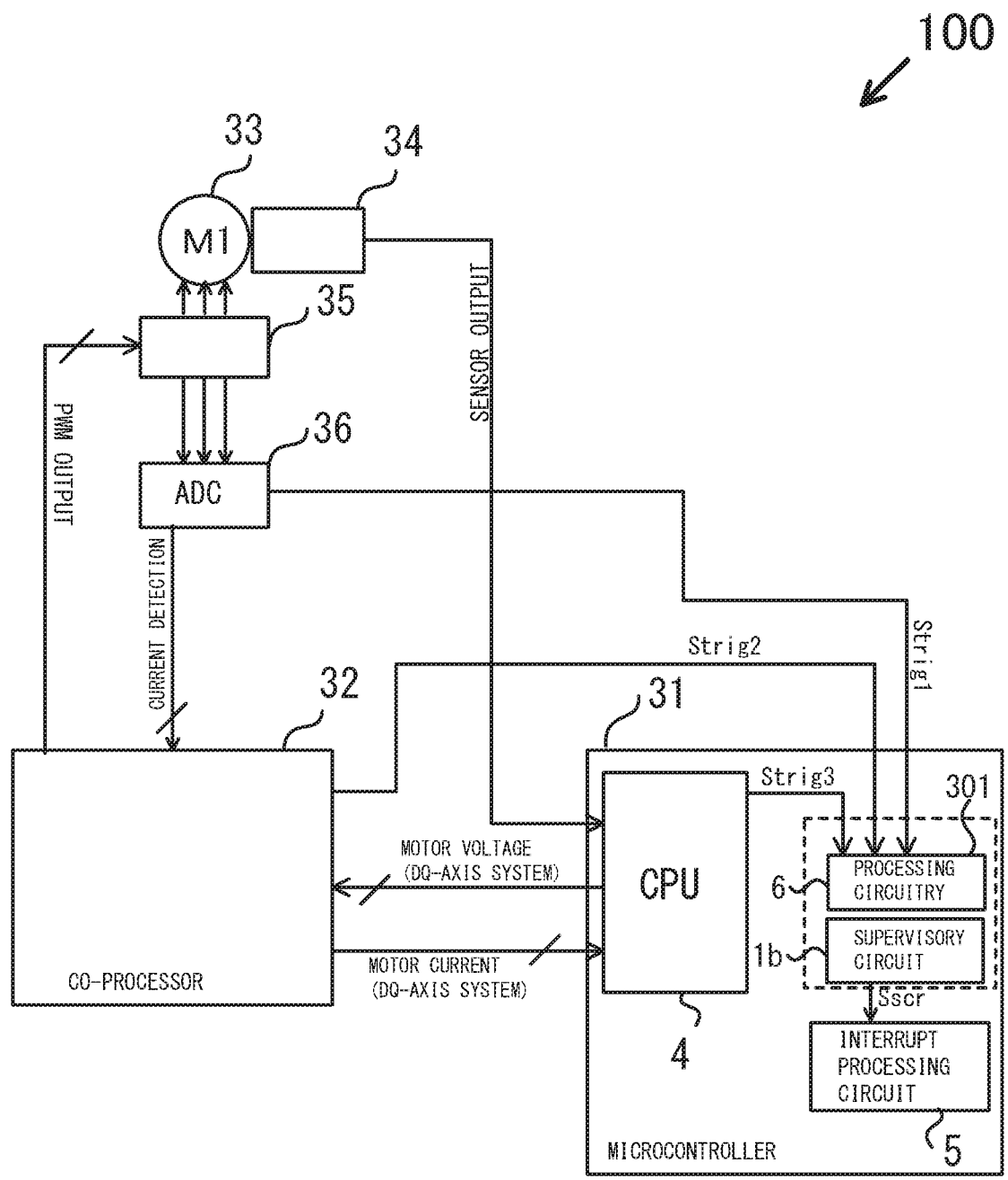
FIG. 6 is a diagram showing a motor control system according to a fifth embodiment.

A motor control system according to a fifth embodiment will be described with reference to FIG. 6. FIG. 6 is a diagram showing the motor control system.

In the fifth embodiment, a supervisory system configured with a processing circuitry and a supervisory circuit is provided to a microcontroller to supervise processing operations by an AD converter, a co-processor, and a CPU. The microcontroller is also called a microcomputer.

Hereinbelow, the same constituent portions as those in the third embodiment are denoted by the same reference numerals as used in the third embodiment and will not be described again. Only different portions will be described.

As shown in FIG. 6, a motor control system 100 includes a microcontroller 31, a co-processor 32, a motor 33, a sensor 34, an inverter 35, and an AD converter 36. The microcontroller 31 includes the supervisory system 301, a CPU 4, and an interrupt processing circuit 5.

Here, the supervisory system 301 has the same configuration and functions as the supervisory system 301 of the third embodiment, and supervises the processing operations by the AD converter, the co-processor, and the CPU.

When the trigger determination circuit 11a (not shown) of the supervisory circuit 1b detects a trigger signal out of setting, the interrupt processing circuit 5 receives an interrupt signal Sscr outputted from the trigger determination circuit 11a and invokes reset. Based on the interrupt signal Sscr, the interrupt processing circuit 5 initializes the motor control system 100.

The motor 33 is a three-phase motor, for example. The sensor 34 is disposed around the motor 33 to detect the operation status, surrounding environment, and the like of the motor and outputs detection information to the CPU 4. The inverter 35 receives a three-phase PWM output signal outputted from the co-processor 32, and outputs a signal to control the rotation of the motor 33 to the motor 33 based on the three-phase PWM output signal.

The AD converter 36 is also called an analog-to-digital converter (ADC). The AD converter 36 executes analog-to-digital signal processing as a signal processing circuit. Specifically, the AD converter 36 detects a current (an analog value) supplied from the inverter 35 to the motor 33, performs analog-to-digital conversion processing on the current to obtain a current detection signal (a digital value), outputs the current detection signal (a digital value) to the co-processor 32, and outputs the current detection signal (a digital value) also to the supervisory system 301 as a trigger signal Strig1.

The co-processor 32 executes digital signal processing. Specifically the co-processor 32 receives a signal outputted from the AD converter 36 and performs phase transformation processing from three phases to two phases and coordinate transformation processing from $\alpha\beta$ to dq, for example. The co-processor 32 outputs a result of the coordinate transformation to the CPU 4 and outputs the result of the coordinate transformation also to the supervisory system 301 as a trigger signal Strig2. The co-processor 32 receives dq-axis-system motor voltage information outputted from the CPU 4, performs reverse coordinate transformation from dq to $\alpha\beta$ and phase transformation from two phases to three phases, generates a three-phase PWM signal, outputs the three-phase PWM signal to the inverter 35, and outputs the three-phase PWM signal also to the supervisory system 301 as a trigger signal Strig2.

The CPU 4 executes digital signal processing. Specifically, the CPU 4 receives a dq-axis-system motor current outputted from the co-processor 32 and receives rotor position information detected by the sensor 34. The CPU 4 performs position detection, speed control, and current control of the motor 33, outputs dq-axis-system motor voltage information to the co-processor 32, and outputs the dq-axis-system motor voltage information also to the supervisory system 301 as a trigger signal Strig3.

Figure 7:
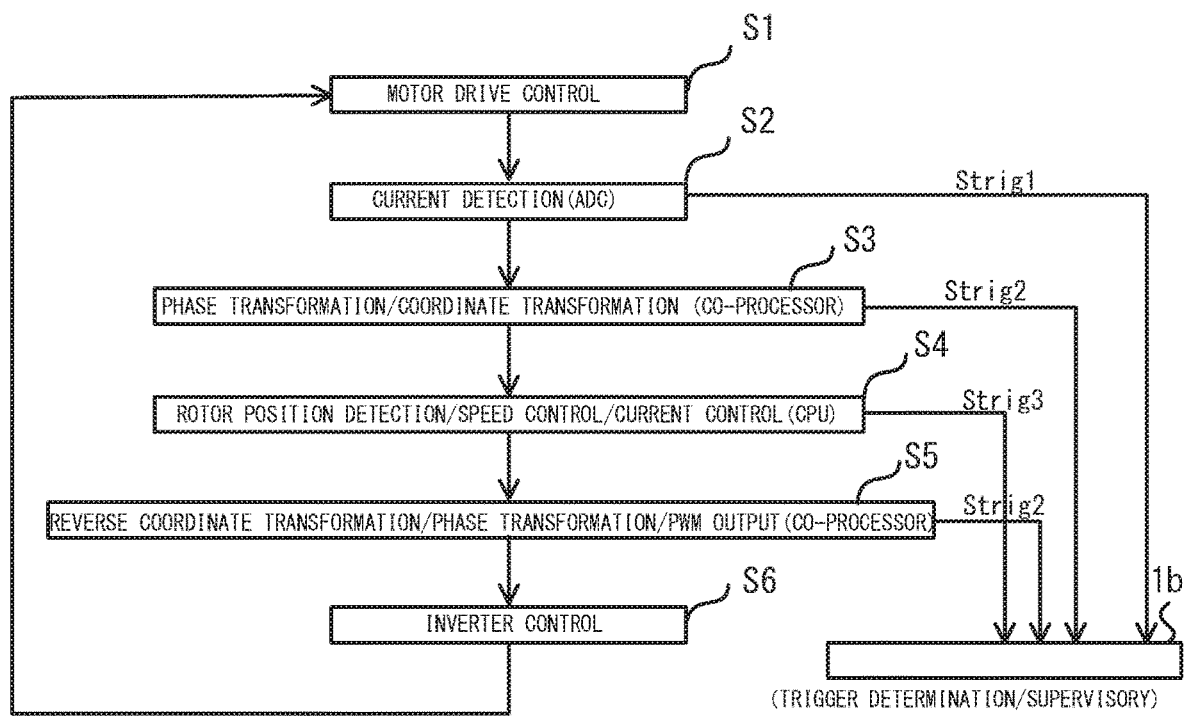
FIG. 7 is a flowchart showing operation of the motor control system according to the fifth embodiment.

Next, operation of the motor control system will be described with reference to FIG. 7. FIG. 7 is a flowchart showing the operation of the motor control system.

As shown in FIG. 7, the motor control system 100 performs motor drive control (Step S1), current detection by the AD converter 36 (Step S2), phase transformation and coordinate transformation by the co-processor 32 (Step S3), rotor position detection, speed control, and current control by the CPU 4 (Step S4), reverse coordinate transformation, phase transformation, and PWM output by the co-processor 32 (Step S5), and inverter control (Step S6) in order.

After the inverter control ends (Step S6), the motor control system 100 starts the motor drive control (Step S1) again, repeating Steps S1 to S6 a plurality of times.

In one cycle from Step S1 to Step S6, the supervisory system 301 receives a current detection signal from the AD converter 36 as a trigger signal Strig1, next receives a result of coordinate transformation from the co-processor 32 as a trigger signal Strig2, then receives motor voltage information from the CPU 4 as a trigger signal Strig3, and then receives a three-phase PWM output signal from the co-processor 32 as a trigger signal Strig2.

The supervisory system 301 supervises and determines whether the trigger signal Strig1, the trigger signal Strig2, and the trigger signal Strig3 are set in a predetermined order. When the trigger signals are not set in a predetermined order (a preset sequence), an interrupt signal Sscr is outputted from the supervisory circuit 1b to the interrupt processing circuit 5 to initialize the motor control system 100.

As described above, the motor control system 100 of the embodiment is provided with the microcontroller 31, the co-processor 32, the motor 33, the sensor 34, the inverter 35, and the AD converter 36. The microcontroller 31 includes the supervisory system 301, the CPU 4, and the interrupt processing circuit 5. In one cycle of operation of the motor 33 in the motor control system 100, the supervisory system 301 receives the trigger signal Strig1 outputted from the AD converter 36, the trigger signals Strig2 outputted from the co-processor 32, and the trigger signal Strig3 outputted from the CPU 4.

Thus, the motor control system 100 of the embodiment can determine and supervise whether the processing operations by the AD converter 36, the co-processor 32, and the CPU 4 are executed in a predetermined order.

In the fifth embodiment, the supervisory system 301 is used in the motor control system 100. However, the invention is not necessarily limited to the above case. The supervisory system 301 may be used in various control systems. For example, the supervisory system 301 may be used in various control systems such as a vehicle autonomous driving control system and a drone flying control system.

Also, in the fifth embodiment, the CPU 4 is provided inside the microcontroller 31, and the co-processor 32 performs phase transformation, coordinate transformation, reverse coordinate transformation, and PWM output. However, the invention is not necessarily limited to the above case. The processing executed by the co-processor 32 may be executed by the CPU 4.

Moreover, in the fifth embodiment, the microcontroller 31 is provided with the supervisory system 301 of the third embodiment. Instead, the microcontroller 31 may be provided with the supervisory system 302 of the fourth embodiment.

Figure 8:
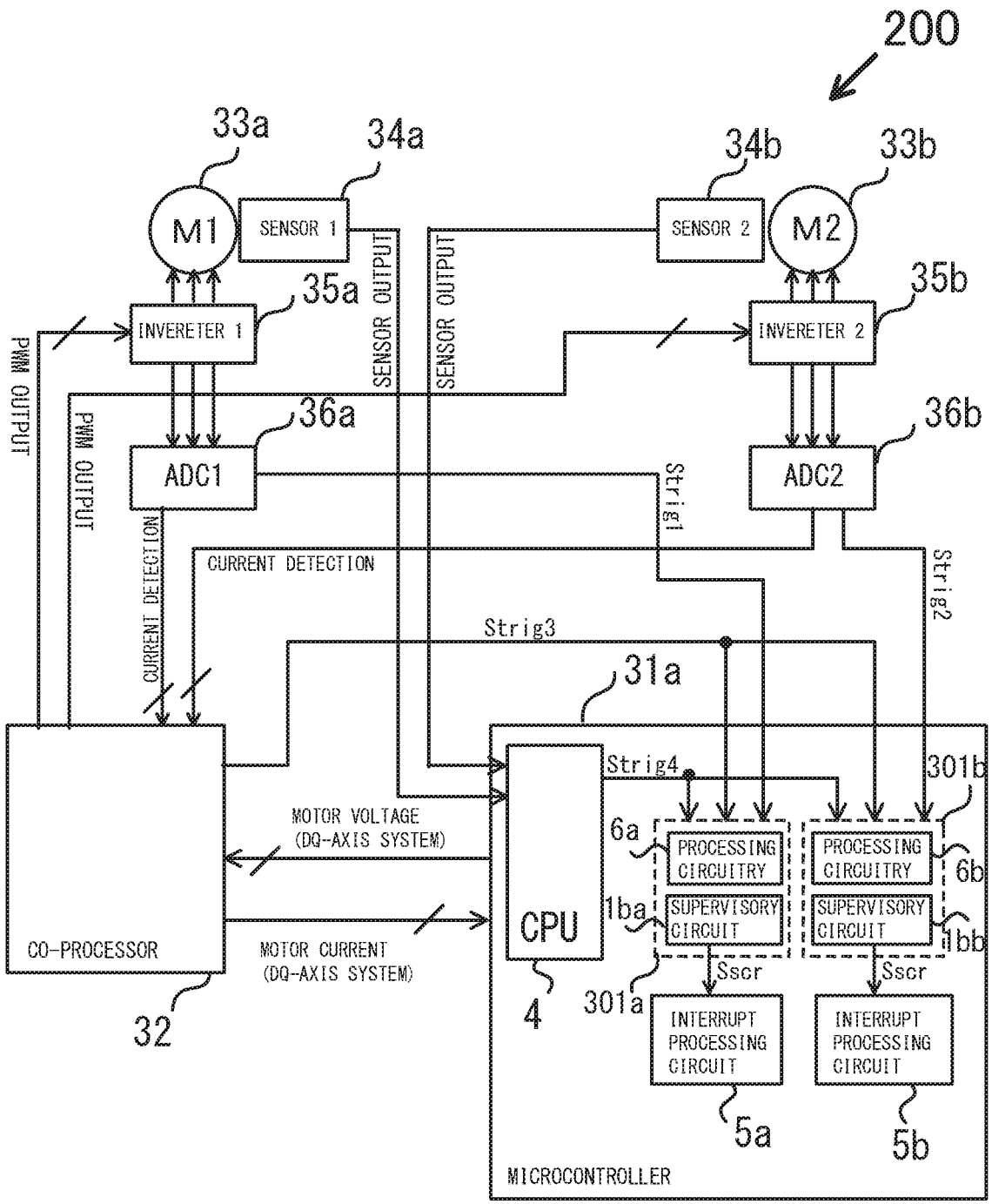
FIG. 8 is a diagram showing a motor control system according to a sixth embodiment.

A motor control system according to a sixth embodiment will be described with reference to FIG. 8. FIG. 8 is a diagram showing the motor control system.

In the motor control system of the sixth embodiment to control two motors, a supervisory system to supervise each of the motors is provided to a microcontroller, and processing operations by an AD converter, a co-processor, and a CPU are supervised.

Hereinbelow, the same constituent portions as those in the fifth embodiment are denoted by the same reference numerals as used in the fifth embodiment and will not be described again. Only different portions will be described.

As shown in FIG. 8, a motor control system 200 includes a microcontroller 31a, the co-processor 32, a motor 33a, a motor 33b, a sensor 34a, a sensor 34b, an inverter 35a, an inverter 35b, an AD converter 36a, and an AD converter 36b.

The motor control system 200 is provided with the sensor 34a, the inverter 35a, and the AD converter 36a on the motor 33a side and with the sensor 34b, the inverter 35b, and the AD converter 36b on the motor 33b side. The motor control system 200 controls the two motors (the motor 33a and the motor 33b) using the microcontroller 31a and the co-processor 32.

The microcontroller 31a includes the CPU 4, an interrupt processing circuit 5a, an interrupt processing circuit 5b, a supervisory system 301a, and a supervisory system 301b. The supervisory system 301a includes a processing circuitry 6a and a supervisory circuit 1ba. The supervisory system 301b includes a processing circuitry 6b and a supervisory circuit 1bb.

Here, the processing circuitry 6a and the processing circuitry 6b have the same configuration as the processing circuitry 6 in FIG. 2. The supervisory circuit 1ba and the supervisory circuit 1bb have the same configuration as the supervisory circuit 1b in FIG. 6.

The AD converter 36a executes analog-to-digital signal processing as a signal processing circuit. Specifically, the AD converter 36a detects a current (an analog value) supplied from the inverter 35a to the motor 33a, performs analog-to-digital conversion on the current to obtain a current detection signal (a digital value), outputs the current detection signal (a digital value) to the co-processor 32, and outputs the current detection signal (a digital value) also to the supervisory system 301a as a trigger signal Strig1.

The AD converter 36b executes analog-to-digital signal processing as a signal processing circuit. Specifically, the AD converter 36b detects a current (an analog value) supplied from the inverter 35b to the motor 33b, performs analog-to-digital conversion on the current to obtain a current detection signal (a digital value), outputs the current detection signal (a digital value) to the co-processor 32, and outputs the current detection signal (a digital value) also to the supervisory system 301b as a trigger signal Strig2.

The co-processor 32 receives signals outputted from the AD converter 36a and the AD converter 36b and performs phase transformation processing from three phases to two phases and coordinate transformation processing from a to dq, for example. The co-processor 32 outputs coordinate transformation results for the motor 33a and the motor 33b to the CPU 4 and outputs the coordinate transformation results for the motor 33a and the motor 33b also to the supervisory system 301a and the supervisory system 301b, respectively, as trigger signals Strig3. The co-processor 32 receives dq-axis-system motor voltage information outputted from the CPU 4, performs reverse coordinate transformation processing from dq to αβ and phase transformation processing from two phases to three phases, generates three-phase PWM signals, outputs the three-phase PWM signals to the inverter 35a and the inverter 35b, and outputs the three-phase PWM signals also to the supervisory system 301a and the supervisory system 301b as trigger signals Strig3.

The CPU 4 receives a dq-axis-system motor current outputted from the co-processor 32 and also receives rotor position information detected by the sensor 34a and the sensor 34b. The CPU 4 performs position detection, speed control, and current control of the motor 33a and the motor 33b, outputs dq-axis-system motor voltage information regarding the motor 33a and the motor 33b to the co-processor 32, and outputs dq-axis-system motor voltage information regarding the motor 33a and the motor 33b also to the supervisory system 301a and the supervisory system 301b as trigger signals Strig4.

Figure 9:
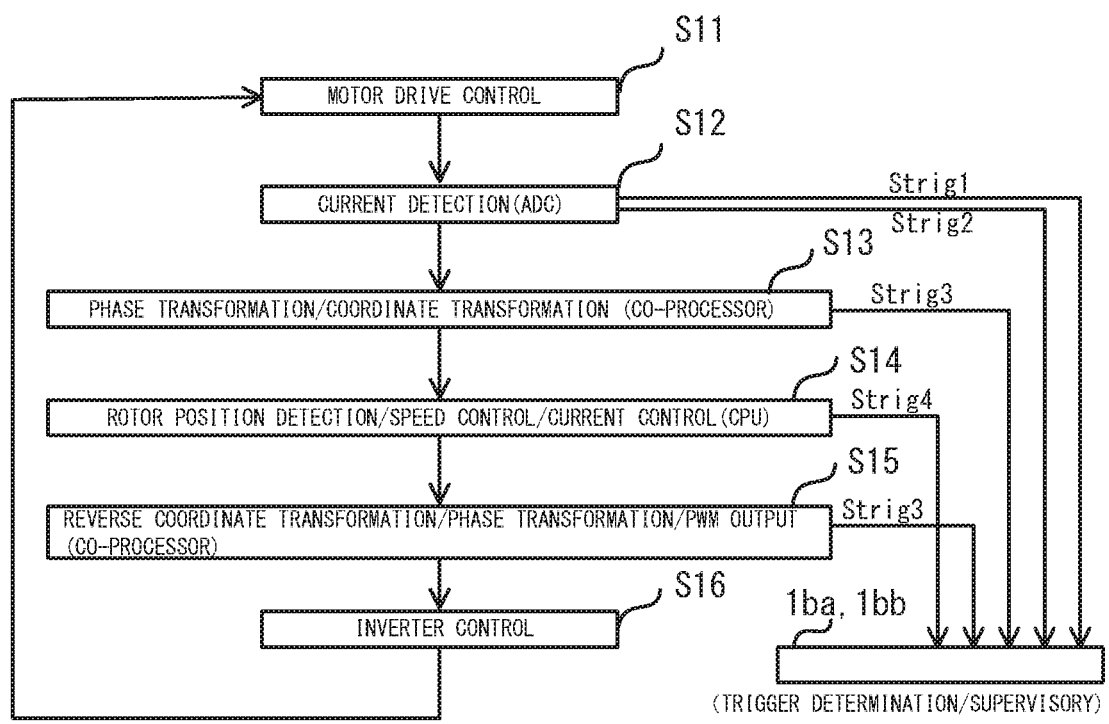
FIG. 9 is a flowchart showing operation of the motor control system according to the sixth embodiment.
Figure 10:
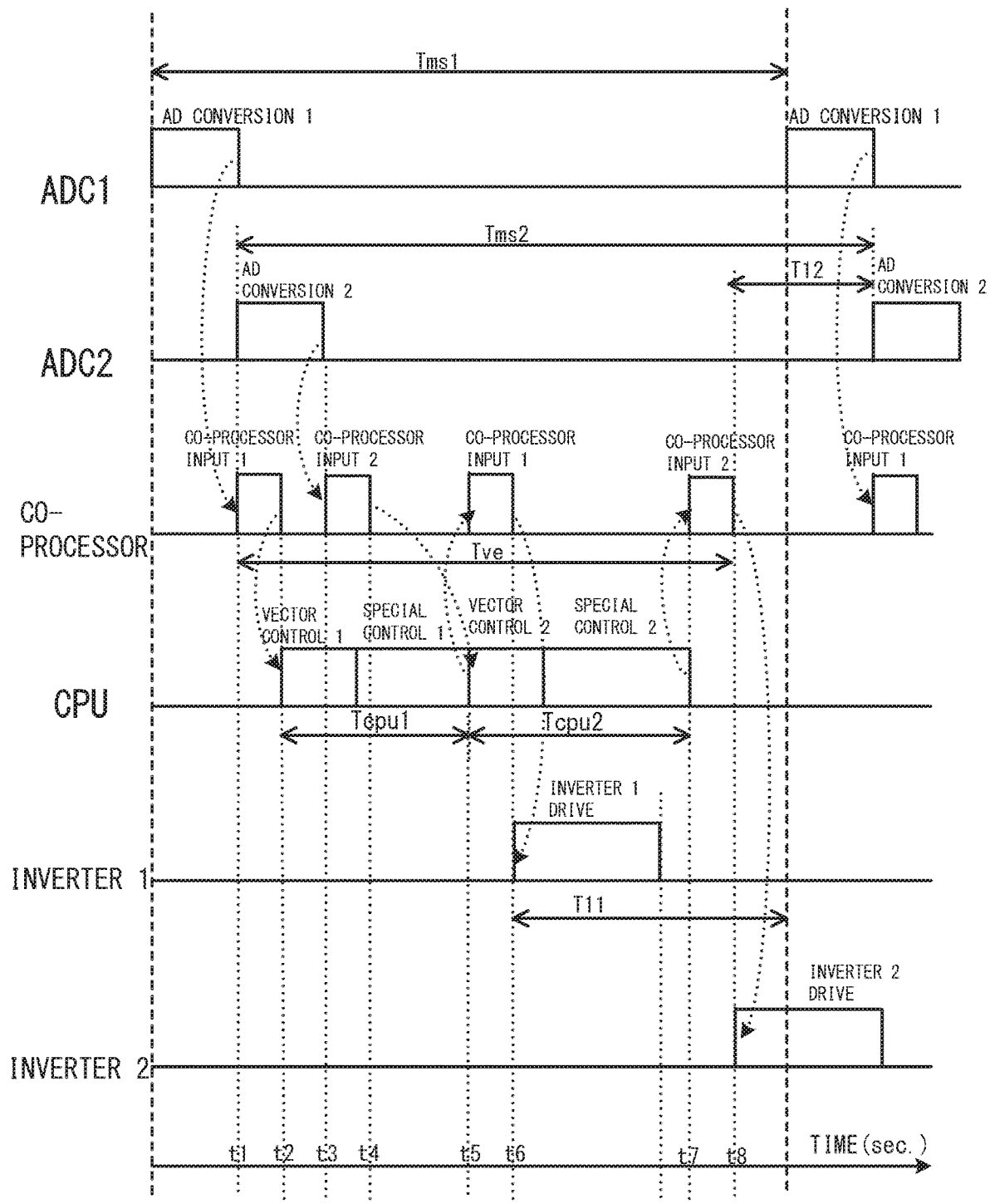
FIG. 10 is a timing chart showing operation of the motor control system according to the sixth embodiment in synchronization.

Next, operation of the motor control system will be described with reference to FIGS. 9 and 10. FIG. 9 is a flowchart showing the operation of the motor control system. FIG. 10 is a timing chart showing the operation of the motor control system in synchronization.

As shown in FIG. 9, the motor control system 200 sequentially performs motor drive control of the motor 33a and the motor 33b (Step S11), current detection by the AD converter 36a and the AD converter 36b (Step S12), phase transformation and coordinate transformation by the co-processor 32 (Step S13), rotor position detection, speed control, and current control by the CPU 4 (Step S14), reverse coordinate transformation, phase transformation, and PWM output by the co-processor 32 (Step S15), and inverter control of the inverter 35a and the inverter 35b (Step S16).

After the inverter control ends (Step S16), the motor control system 200 starts the motor drive control (Step S11) again, repeating the steps (Steps S11 to S16) a plurality of times.

In one cycle from Steps S11 to S16, the supervisory system 301a receives a current detection signal from the AD converter 36a as a trigger signal Strig1. The supervisory system 301b receives a current detection signal from the AD converter 36b as a trigger signal Strig2. Next, the supervisory system 301a and the supervisory system 301b receive coordinate transformation results on the motor 33a and the motor 33b from the co-processor 32 as trigger signals Strig3, then receive motor voltage information on the motor 33a and the motor 33b from the CPU 4 as trigger signals Strig4, and next receive three-phase PWM output signals about the motor 33a and the motor 33b from the co-processor 32 as trigger signals Strig2.

The supervisory system 301a supervises and determines whether the trigger signal Strig1, the trigger signal Strig3, and the trigger signal Strig4 are executed in a predetermined order. When the trigger signals are not in a predetermined order, an interrupt signal Sscr is outputted from the supervisory circuit 1ba to the interrupt processing circuit 5a, and the motor control system 200 is initialized.

The supervisory system 301b supervises and determines whether the trigger signal Strig2, the trigger signal Strig3, and the trigger signal Strig4 are executed in a predetermined order. When the trigger signals are not in a predetermined order, an interrupt signal Sscr is outputted from the supervisory circuit 1bb to the interrupt processing circuit 5b, and the motor control system 200 is initialized.

As shown in FIG. 10, when triggers to the inverter 35a and the inverter 35b are in synchronization (normal operation), analog-to-digital conversion processing by the AD converter 36b is executed right after analog-to-digital conversion processing by the AD converter 36a. The supervisory system 301a receives a trigger signal Strig1 about the motor 33a (an output from ADC1) at time point t1, and then receives a trigger signal Strig3 about the motor 33a (an output from the co-processor 32) at time point t2. The supervisory system 301b receives a trigger signal Strig2 about the motor 33b (an output from ADC2) at time point t3, and then receives a trigger signal Strig3 about the motor 33b (an output from the co-processor 32) at time point t4.

In FIG. 10, an interval for the motor 33a is denoted as a motor interval Tms1, and an interval for the motor 33b is denoted as a motor interval Tms2. For example, the motor interval Tms1 and the motor interval Tms2 have the same value and set to 50 μs. The interval for PWM control of the motor 33a by the co-processor 32 and the interval for PWM control of the motor 33b by the co-processor 32 are set to be the same, but may be different.

The CPU 4 executes vector control 1 and special control 1 for the motor 33a within a CPU processing time Tcpu1. At time point t5 which is right after the vector control 1 and the special control 1 end, the supervisory system 301a receives a trigger signal Strig4 about the motor 33a (a CPU output), and the CPU 4 executes vector control 2 and special control 2 for the motor 33b within a CPU processing time Tcpu2. The special control 1 is processing other than the vector control 1.

The inverter 35a receives a three-phase PWM signal from the co-processor 32 and performs inverter control. At time point t6, the supervisory system 301a receives a trigger signal Strig3 about the motor 33a (an output from the co-processor 32).

At time point t7 which is after the vector control 2 and the special control 2 for the motor 33b end, the supervisory system 301b receives a trigger signal Strig4 about the motor 33b (a CPU output). The inverter 35b receives a three-phase PWM signal from the co-processor 32 and performs inverter control. At time point t8, the supervisory system 301b receives a trigger signal Strig3 about the motor 33b (an output from the co-processor 32).

The supervisory system 301a determines and supervises whether the trigger signal Strig1 (the output from ADC1), the trigger signals Strig3 (the coordinate transformation information on the motor 33a from the co-processor 32 to the CPU 4 and the three-phase PWM output about the motor 33a from the co-processor 32 to the inverter 35a), and the trigger signal Strig4 (the motor voltage information on the motor 33a from the CPU 4 to the co-processor 32) are processed in a predetermined order (specifically, time point t1, time point t2, time point t5, and time point t6).

The supervisory system 301b determines and supervises whether the trigger signal Strig2 (the output from ADC2), the trigger signals Strig3 (the coordinate transformation information on the motor 33b from the co-processor 32 to the CPU 4 and the three-phase PWM output on the motor 33b from the co-processor 32 to the inverter 35b), and the trigger signal Strig4 (the motor voltage information on the motor 33b from the CPU 4 to the co-processor 32) are processed in a predetermined order (specifically, in the order of time point t3, time point t4, time point t7, and time point t8).

As shown in FIG. 10, with a period of time between time point t6 at which the inverter 35a (the inverter 1) starts driving and a time point at which the AD converter 36a starts AD conversion being referred to as time allowance T11 for the motor 33a, it is shown in FIG. 10 that T11>0 (zero). Similarly, with a period of time between time point t8 at which the inverter 35b (the inverter 2) starts driving and a time point at which the AD converter 36b starts AD conversion being referred to as time allowance T12 for the motor 33b, it is shown in FIG. 10 that T12>0 (zero). In other words, it is shown that the operation is performed normally.

As described above, the motor control system 200 of the embodiment is provided with the microcontroller 31a, the co-processor 32, the motor 33a, the motor 33b, the sensor 34a, the sensor 34b, the inverter 35a, the inverter 35b, the AD converter 36a, and the AD converter 36b. The microcontroller 31a includes the supervisory system 301a, the supervisory system 301b, the CPU 4, the interrupt processing circuit 5a, and the interrupt processing circuit 5b. During operation of the motor 33a in the motor control system 200, the supervisory system 301a receives the trigger signal Strig1 outputted from the AD converter 36a, the trigger signal Strig3 outputted from the co-processor 32, and the trigger signal Strig4 outputted from the CPU 4. During operation of the motor 33b in the motor control system 200, the supervisory system 301b receives the trigger signal Strig2 outputted from the AD converter 36b, the trigger signal Strig3 outputted from the co-processor 32, and the trigger signal Strig4 outputted from the CPU 4.

Thus, the motor control system 200 of the embodiment can determine and supervise whether the processing operations by the AD converter 36a, the AD converter 36b, the co-processor 32, and the CPU 4 are executed in a predetermined order.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A supervisory circuit comprising:
 a trigger determination circuit configured to receive signal processing signals outputted from a plurality of signal processing circuits as trigger signals, determine whether processing operations by the signal processing circuits are executed in a predetermined order, and output an interrupt signal when detecting a trigger signal out of setting; and
 a trigger table comprising trigger-specific tables corresponding to the respective signal processing circuits, wherein the trigger table is configured to:
  determine a second predetermined order of the trigger signals based on a plurality of signals received from the trigger determination circuit; and output a table read signal corresponding to the second predetermined order to the trigger determination circuit.

2. The supervisory circuit according to claim 1, wherein the signal processing circuits each execute analog-digital signal processing or digital signal processing, and
 the analog-digital signal processing includes analog-to-digital conversion processing and digital-to-analog conversion processing.

3. The supervisory circuit according to claim 1, further comprising a memory configured to store sequence determination information, wherein
 it is determined based on the sequence determination information whether the trigger signals are set in the predetermined order.

4. The supervisory circuit according to claim 1, wherein the predetermined order includes at least one of
 the trigger signals being outputted in a chronological order,
 the trigger signals being in an interchanged order,
 the trigger signals being outputted alternately,
 the trigger signals being in synchronization, and
 the trigger signals being out of synchronization.

5. The supervisory circuit according to claim 1, wherein the interrupt signal is used as system initialization or notification information to a central processing unit (CPU).

6. A supervisory system comprising:
 a processing circuitry configured to sequentially execute a plurality of sets of program processing, have the plurality of sets of program processing interrupted by signal processing signals outputted from a plurality of signal processing circuits, and output the plurality of sets of interrupted program processing as a register write signal; and a supervisory circuit including
- a clear code detection circuit configured to receive the register write signal and select one of the plurality of sets of interrupted program processing as a particular clear code,
- a trigger determination circuit configured to receive the signal processing signals outputted from the signal processing circuits as trigger signals, receive the particular clear code, determine whether processing operations by the signal processing circuits and the particular clear code are executed in a predetermined order, and output an interrupt signal when detecting a trigger signal out of setting, and
- a trigger table comprising trigger-specific tables corresponding to the respective signal processing circuits and a register-specific table corresponding to the particular clear code, wherein the trigger table is configured to:
  - determine a second predetermined order of the trigger signals based on a plurality of signals received from the trigger determination circuit; and output a table read signal corresponding to the second predetermined order to the trigger determination circuit.

7. The supervisory system according to claim 6, wherein the processing circuitry is provided to any one of a microcontroller, a processor, a CPU, and a microprocessing unit (MPU).

8. The supervisory system according to claim 6, wherein the supervisory circuit further includes a memory to store sequence determination information, and
it is determined based on the sequence determination information whether the trigger signals are set in the predetermined order.

9. The supervisory system according to claim 6, wherein the signal processing signals are each a signal having undergone digital signal processing or analog-digital signal processing.

10. The supervisory system according to claim 6, wherein the predetermined order includes at least one of
the trigger signals being outputted in a chronological order,
the trigger signals being in an interchanged order,
the trigger signals being outputted alternately,
the trigger signals being in synchronization, and
the trigger signals being out of synchronization.

11. The supervisory system according to claim 6, wherein the interrupt signal is used as system initialization or notification information to a CPU.

12. The supervisory system according to claim 6, further comprising:
a counter;
a counter upper-limit setting register; and
a comparator, wherein
the trigger table is further provided with initial value effecting tables corresponding to the trigger-specific tables and the register-specific table, respectively,
the counter counts information in the initial value effecting tables, and
the comparator compares a counter value from the counter with an upper-limit value for the counter stored in the counter upper-limit setting register, and generates an interrupt signal when the particular clear code is not executed.

13. The supervisory system according to claim 6, further comprising:
a counter;
an OR circuit; and
a comparator, wherein
the trigger table is further provided with counter upper-limit value tables corresponding to the trigger-specific tables and the register-specific table, respectively,
the counter counts information in the counter upper-limit value tables,
the OR circuit receives signals outputted from the trigger determination circuit and executes logical operation processing,
the counter receives information outputted from the OR circuit as initialization information and starts a count operation, and
the comparator compares information in the counter upper-limit value tables with a counter value from the counter, and generates an interrupt signal when a next trigger is not inputted within a set inter-trigger time period.

14. A motor control system comprising:
an AD converter configured to detect a current flowing through a motor;
a co-processor configured to receive a current detection signal detected by the AD converter and execute phase transformation, coordinate transformation, reverse coordinate transformation, and generation of an PWM signal;
a CPU configured to receive coordinate information outputted from the co-processor as a result of the coordinate transformation, execute speed control and current control of the motor, and output motor voltage information to the co-processor; and
a supervisory system configured to receive the current detection signal outputted from the AD converter as a first trigger signal, receive the coordinate information and the PWM signal outputted from the co-processor as second trigger signals, receive the motor voltage information outputted from the CPU as a third trigger signal, determine whether the first trigger signal, the second trigger signals, and the third trigger signal are executed in a predetermined order, and output an interrupt signal when detecting a trigger signal out of setting wherein
the supervisor system includes a processing circuitry and a supervisor circuit,
the processing circuitry sequentially executes a plurality of sets of program processing, has the plurality of sets of program processing interrupted by signal processing signals outputted from a plurality of signal processing circuits, and outputs the plurality of sets of interrupted program processing as a register write signal,
the supervisory circuit has
a clear code detection circuit to receive the register write signal and select one of the plurality of sets of interrupted program processing as a particular clear code,
a trigger determination circuit to receive the signal processing signals outputted from the signal processing circuits as trigger signals, receive the particular clear code, determine whether processing operations by the signal processing circuits and the particular clear code are executed in a predetermined order, and output an interrupt signal when detecting a trigger signal out of setting, and
a trigger table comprising trigger-specific tables corresponding to the respective signal processing circuits and a register-specific table corresponding to the particular clear code wherein the trigger table is configured to:
  determine a second predetermined order of the trigger signals based on a plurality of signals received from the trigger determination circuit, and
  output a table read signal corresponding to the second predetermined order to the trigger determination circuit.

15. The motor control system according to claim 4, further comprising an interrupt processing circuit to invoke reset upon receiving the interrupt signal when a trigger signal out of setting is detected.

16. The motor control system according to claim 15, wherein
  the CPU, the supervisory system, and the interrupt processing circuit are incorporated in a microcontroller.

17. The motor control system according to claim 14, further comprising a sensor disposed around the motor, the sensor being to detect an operation status and a surrounding environment of the motor and output detection information to the CPU.

* * * * *